United States Patent
Hada et al.

(10) Patent No.: US 6,982,140 B2
(45) Date of Patent: *Jan. 3, 2006

(54) POSITIVE RESIST COMPOSITION AND METHOD OF FORMING RESIST PATTERN

(75) Inventors: Hideo Hada, Kawasaki (JP); Satoshi Fujimura, Kawasaki (JP); Jun Iwashita, Kawasaki (JP)

(73) Assignee: Tokyo Ohka Kogyo., Ltd., Kawasaki (JP)

( * ) Notice: Subject to any disclaimer, the term of this patent is extended or adjusted under 35 U.S.C. 154(b) by 241 days.

This patent is subject to a terminal disclaimer.

(21) Appl. No.: 10/466,172

(22) PCT Filed: Nov. 29, 2002

(86) PCT No.: PCT/JP02/12538

§ 371 (c)(1),
(2), (4) Date: Jul. 14, 2003

(87) PCT Pub. No.: WO03/048863

PCT Pub. Date: Jun. 12, 2003

(65) Prior Publication Data

US 2004/0058269 A1 Mar. 25, 2004

(30) Foreign Application Priority Data

Dec. 3, 2001 (JP) .................................. 2001-369340

(51) Int. Cl.
*G03F 7/004* (2006.01)
*G03F 7/30* (2006.01)

(52) U.S. Cl. .................... 430/270.1; 430/326; 430/905; 430/910

(58) Field of Classification Search .............. 430/270.1, 430/326, 905, 910

See application file for complete search history.

(56) References Cited

U.S. PATENT DOCUMENTS 5,968,713 A 10/1999 Nozaki et al. .............. 430/326
6,004,720 A 12/1999 Takechi et al. ........... 430/270.1
6,013,416 A 1/2000 Nozaki et al. ............. 430/283.1
6,200,725 B1 3/2001 Takechi et al. ........... 430/270.1
6,329,125 B2 12/2001 Takechi et al. ............... 430/326
6,344,304 B1 2/2002 Takechi et al. ........... 430/270.1
6,479,211 B1 * 11/2002 Sato et al. ................ 430/270.1
2003/0087183 A1 * 5/2003 Nishi et al. ............... 430/270.1

FOREIGN PATENT DOCUMENTS

| JP | 02-146803 | 2/1992 |
| JP | 04-156818 | 12/1993 |
| JP | 2881969 | 11/1996 |
| JP | 09-130131 | 12/1998 |
| JP | 09-165935 | 1/1999 |
| JP | 11-037847 | 7/2000 |
| JP | 11-146775 | 12/2000 |
| KR | 2000-0077438 | 12/2000 |

OTHER PUBLICATIONS

PCT/ISA/220 Search Report of PCT/JP02/12538.

* cited by examiner

*Primary Examiner*—John S. Chu
(74) *Attorney, Agent, or Firm*—Dechert LLP; John W. Ryan

(57) ABSTRACT

There is provided a positive type resist composition formed by dissolving (A) a resin component with a unit derived from a (meth)acrylate ester in the principal chain, for which the solubility in alkali increases under the action of acid, and (B) an acid generator component which generates acid on exposure, in an organic solvent component (C), wherein the resin component (A) is a copolymer comprising (a1) a unit derived from a (meth)acrylate ester comprising an acid dissociable, dissolution inhibiting group containing a polycyclic group, (a2) a unit derived from a (meth)acrylate ester comprising a lactone containing monocyclic group or polycyclic group, (a3) a unit derived from a (meth)acrylate ester comprising a hydroxyl group containing polycyclic group, and (a4) a unit derived from a (meth)acrylate ester comprising a polycyclic group which is different from the unit (a1), the unit (a2) and the unit (a3). This composition provides a chemically amplified positive type resist composition which displays excellent resolution, enables the depth of focus range of an isolated resist pattern to be improved, and enables the proximity effect to be suppressed.

12 Claims, No Drawings

POSITIVE RESIST COMPOSITION AND METHOD OF FORMING RESIST PATTERN

TECHNICAL FIELD

The present invention relates to a chemically amplified positive type resist composition suitable for use in a process using a wavelength of no more than 200 nm, and particularly an ArF excimer laser, as the light source, as well as a resist pattern formation method using such a composition.

BACKGROUND ART

Conventionally, polyhydroxystyrenes or derivatives thereof in which the hydroxyl groups are protected with an acid dissociable, dissolution inhibiting group, which display high transparency relative to a KrF excimer laser (248 nm), have been used as the resin component of chemically amplified resists.

However, these days, the miniaturization of semiconductor elements has progressed even further, and the development of processes using ArF excimer lasers (193 nm) is being vigorously pursued.

For processes using an ArF excimer laser as the light source, resins comprising a benzene ring such as polyhydroxystyrene have insufficient transparency relative to the ArF excimer laser (193 nm), and are consequently unsuitable for use in such processes.

Accordingly, in order to resolve this problem, resins containing no benzene rings, but comprising a unit within the principal chain derived from an acrylate ester or a methacrylate ester with a polycyclic hydrocarbon group such as an adamantane skeleton provided at the ester section, thereby offering excellent dry etching resistance, are attracting considerable interest, and many materials have already been proposed (Japanese Patent (Granted) Publication No. 2881969, Japanese Unexamined Patent Application, First Publication No. Hei 5-346668, Japanese Unexamined Patent Application, First Publication No. Hei 7-234511, Japanese Unexamined Patent Application, First Publication No. Hei 9-73173, Japanese Unexamined Patent Application, First Publication No. Hei 9-90637, Japanese Unexamined Patent Application, First Publication No. Hei 10-161313, Japanese Unexamined Patent Application, First Publication No. Hei 10-319595 and Japanese Unexamined Patent Application, First Publication No. Hei 11-12326).

However, in recent years the design rules required in semiconductor element production continue to become more stringent, and resolutions in the vicinity of 150 nm or 100 nm are necessary, and further improvements in resolution are keenly sought.

Furthermore, in addition to these types of improvements in resolution, in the formation processes for resist patterns in which the ratio between the size of the resist line sections relative to the size of the space sections is less than 1, the formation of so-called isolated resist patterns, in which, for example, the ratio of the size of the resist line sections relative to the size of the space sections is ⅕, are now also becoming increasingly necessary.

However, with conventional resists a problem arises in that the depth of focus range of this type of isolated resist pattern is unsatisfactory, and improvements are desirable.

Furthermore, in a pattern formation process in which isolated resist pattern sections of the type described above (sparse pattern sections) and pattern sections in which the line and space ratio is 1:1 (dense pattern sections) are mixed, a difference develops in the resist pattern size between the sparse pattern sections and the dense pattern sections, producing a so-called proximity effect problem, and in conventional resists, suppressing this type of proximity effect is difficult, and consequently improvements in this area are also keenly sought.

DISCLOSURE OF INVENTION

The present invention takes the above circumstances into consideration, with an object of providing a chemically amplified positive type resist composition which displays excellent resolution, and enables improvements in the depth of focus range of an isolated resist pattern, and suppression of any proximity effect, as well as a resist pattern formation method using such a composition.

As a result of intensive research aimed at achieving the above object, the inventors of the present invention discovered that by using, as a base resin, a resin component comprising within the principal chain a unit derived from a (meth)acrylate ester containing a specific quaternary copolymer, and for which the solubility in alkali increases under the action of acid, the above object could be achieved, and they were thus able to complete the present invention.

In other words, a positive type resist composition of the present invention is a positive type resist composition formed by dissolving (A) a resin component with a unit derived from a (meth)acrylate ester in the principal chain, for which the solubility in alkali increases under the action of acid, and (B) an acid generator component which generates acid on exposure, in an organic solvent component (C), wherein the resin component (A) is a copolymer comprising (a1) a unit derived from a (meth)acrylate ester comprising an acid dissociable, dissolution inhibiting group containing a polycyclic group, (a2) a unit derived from a (meth)acrylate ester comprising a lactone containing monocyclic group or polycyclic group, (a3) a unit derived from a (meth)acrylate ester comprising a hydroxyl group containing polycyclic group, and (a4) a unit derived from a (meth)acrylate ester comprising a polycyclic group which is different from the unit (a1), the unit (a2) and the unit (a3).

In this description and the accompanying claims, the term "lactone containing monocyclic group or polycyclic group" refers to a monocyclic group formed from a lactone ring or a polycyclic group containing a lactone ring. Here, a lactone ring refers to a single ring comprising a —CO—O— structure, and this is counted as the first ring. Accordingly, in the case of a group with only a lactone ring, the name "lactone containing monocyclic group" is used, whereas in the case of a group which also contains other ring structures, the name "lactone containing polycyclic group" is used regardless of the structure of the other rings.

In the present description, the aforementioned units derived from a (meth)acrylate ester are units represented by a general formula (5) shown below, including units derived from an acrylate ester in which R is a hydrogen atom, units derived from a methacrylate ester in which R is a methyl group, and units in which R is a lower alkyl group of 2 to 5 carbon atoms, or more specifically a straight chain or branched alkyl group such as an ethyl group, a propyl group, an isopropyl group, an n-butyl group, an isobutyl group, a tert-butyl group, a pentyl group an isopentyl group or a neopentyl group.

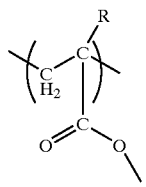

(5)

Furthermore, a resist pattern formation method of the present invention comprises the steps of providing a positive type resist composition described above on a substrate, conducting a prebake at 80 to 150° C. for 40 to 120 seconds, performing selective exposure, and then conducting post exposure baking at 80 to 150° C. for 40 to 120 seconds, and performing alkali developing to form a resist pattern in which the ratio of the line section size relative to the space section size is no more than 1.

BEST MODE FOR CARRYING OUT THE INVENTION

In a positive type resist composition of the present invention, a resin component (A) utilizes a resin with a unit derived from a (meth)acrylate ester within the principal chain, for which the solubility in alkali increases under the action of acid. In other words, the resin component (A) utilizes an alkali developing resin which has an acid dissociable, dissolution inhibiting group, and which on elimination of this group using the acid generated by the acid generator, changes from an alkali insoluble state to an alkali soluble state. By using this type of resin, the exposed sections of the composition display a significant increase in solubility relative to alkali, and become alkali soluble, whereas the unexposed sections remain insoluble in alkali.

Specifically, the resin component (A) is a copolymer comprising (a1) a unit derived from a (meth)acrylate ester comprising an acid dissociable, dissolution inhibiting group containing a polycyclic group, (a2) a unit derived from a (meth)acrylate ester comprising a lactone containing monocyclic group or polycyclic group, (a3) a unit derived from a (meth)acrylate ester comprising a hydroxyl group containing polycyclic group, and (a4) a unit derived from a (meth)acrylate ester comprising a polycyclic group which is different from the unit (a1), the unit (a2) and the unit (a3). By incorporating each of these units (a1) through (a4), the resin component (A) enables an improvement in the depth of focus of an isolated resist pattern, and also enables a reduction in the proximity effect, and as a result enables formation of a resist pattern which is faithful to the mask pattern, for both sparse and dense patterns.

The unit (a1) is a unit derived from a (meth)acrylate ester comprising an acid dissociable, dissolution inhibiting group containing a polycyclic group. Examples of the polycyclic group include bicycloalkanes, tricycloalkanes and tetracycloalkanes groups, including groups in which one hydrogen atom is removed from a polycycloalkane such as adamantane, norbornane, isobornane, tricyclodecane and tetracyclododecane. A multitude of these groups have been proposed for use with ArF resists, and in the present invention, the polycyclic group can be selected appropriately from amongst this multitude of groups. Of these groups, adamantyl groups, norbornyl groups and tetracyclododecanyl groups are preferred in terms of their industrial availability.

As described above, the acid dissociable, dissolution inhibiting group has an alkali dissolution inhibiting effect prior to exposure which makes the entire resin component (A) insoluble in alkali, but is eliminated following exposure through the action of the acid generated by the acid generator component (B) described below, causing the entire resin component (A) to become alkali soluble. Well known examples of this type of acid dissociable, dissolution inhibiting group include cyclic or chain type tertiary alkyl esters formed with the carboxyl group of (meth)acrylic acid.

Provided the structural unit (a1) has the aforementioned functions, there are no particular restrictions on the structural unit and any suitable unit can be used, although at least one type of unit selected from the general formulas (1), (2) and (3) shown below is preferred as such units display excellent resolution and dry etching resistance.

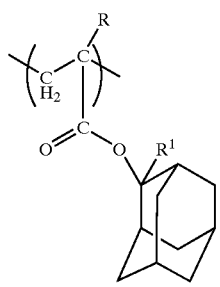

(1)

wherein, R represents a hydrogen atom or a lower alkyl group, and $R^1$ represents a lower alkyl group.

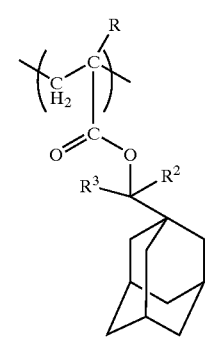

(2)

wherein, R represents a hydrogen atom or a lower alkyl group, and $R^2$ and $R^3$ each represent, independently, a lower alkyl group.

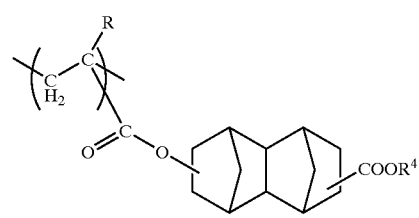

(3)

wherein, R represents a hydrogen atom or a lower alkyl group, and $R^4$ represents a tertiary alkyl group.

The unit represented by the general formula (1) represents the case in which the carbon atom adjacent to the oxygen atom (—O—) of a (meth)acrylic acid ester section becomes a tertiary alkyl group on a cyclic skeleton such as an adamantyl group. Examples of the group R include hydrogen atoms or methyl groups, as well as lower alkyl groups of 2 to 5 carbon atoms, or more specifically, straight chain or branched alkyl groups such as ethyl groups, propyl groups, isopropyl groups, n-butyl groups, isobutyl groups, tert-butyl groups, pentyl groups, isopentyl groups and neopentyl groups. Furthermore, examples of the group $R^1$ include lower straight chain or branched alkyl groups such as methyl groups, ethyl groups, propyl groups, isopropyl groups, n-butyl groups, isobutyl groups, tert-butyl groups, pentyl groups, isopentyl groups and neopentyl groups. Here, if $R^1$ is an alkyl group of at least 2 carbon atoms, then the acid dissociability tends to increase compared with the case in which $R^1$ is a methyl group, which is preferred. However, from an industrial viewpoint, methyl groups are the most desirable.

The unit represented by the general formula (2) represents the case in which the carbon atom adjacent to the oxygen atom (—O—) of a (meth)acrylic acid ester section is a tertiary alkyl group, and a cyclic skeleton such as an adamantyl group exists within this tertiary alkyl group. In the unit represented by the general formula (2), R represents the same meaning as that defined above for the general formula (1), and $R^2$ and $R^3$ each represent, independently, a lower alkyl group, or in other words a straight chain or branched alkyl group of 1 to 5 carbon atoms as described above. These types of groups tend to display a higher acid dissociability than a 2-methyl-2-adamantyl group. Units in which both $R^2$ and $R^3$ are methyl groups are preferred industrially.

The unit represented by the general formula (3) represents the case in which the carbon atom adjacent to the oxygen atom (—O—) of a separate ester section to the (meth)acrylate ester section is a tertiary alkyl group, and the separate ester section and the (meth)acrylate ester section are linked with a cyclic skeleton such as a tetracyclododecanyl group. In the unit represented by the general formula (3), R represents the same meaning as that defined above for the general formula (1), and $R^4$ represents a tertiary alkyl group such as a tert-butyl group or a tert-amyl group. Units in which $R^4$ is a tert-butyl group are preferred industrially.

Furthermore, of the units represented by these general formulas (1) to (3), units represented by the general formula (1) in which $R^1$ is either a methyl group or an ethyl group offer particularly good resolution, and are consequently preferred.

The unit (a2) is a unit derived from a (meth)acrylate ester comprising a lactone containing monocyclic group or polycyclic group. Lactone functional groups are effective in increasing the adhesion of a resist film formed from a composition of the present invention to a substrate, and in improving the affinity with the developing liquid. There are no particular restrictions on the unit (a2), provided this type of lactone functional group and cyclic group are present, and any suitable unit can be used. Specific examples of a lactone containing monocyclic group include a group in which one hydrogen atom is removed from γ-butyrolactone, whereas examples of lactone containing polycyclic groups include groups in which one hydrogen atom is removed from a bicycloalkane, a tricycloalkane or a tetracycloalkane containing a lactone group. In particular, groups in which one hydrogen atom is removed from either a lactone containing bicycloalkane with a structural formula (6) shown below, or a bicycloalkane with a structural formula (7) shown below are preferred in terms of their industrial availability and the like.

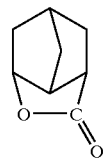

(6)

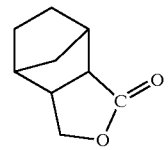

(7)

Specifically, the unit (a2) is derived from a (meth)acrylate ester comprising a lactone group, a lactone containing monocycloalkyl group or a lactone containing bicycloalkyl group. More specific examples of the unit (a2) include the units represented by the general formulas (8) to (10) shown below.

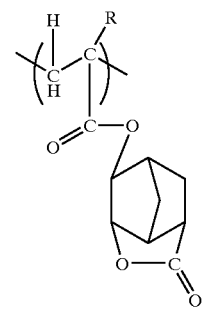

(8)

wherein, R represents a hydrogen atom or a lower alkyl group.

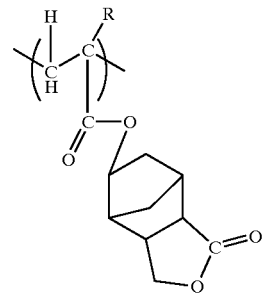

(9)

wherein, R represents a hydrogen atom or a lower alkyl group.

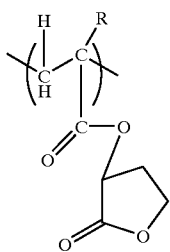
(10)

wherein, R represents a hydrogen atom or a lower alkyl group.

Furthermore, amongst the units represented by these types of general formulas (8) to (10), γ-butyrolactone esters of (meth)acrylic acid with an ester linkage at the α carbon atom, or in other words, units derived from (meth)acrylate esters of γ-butyrolactone, offer superior suppression and reduction of proximity effects, and are consequently preferred.

The unit (a3) is a unit derived from a (meth)acrylate ester comprising a hydroxyl group containing polycyclic group, and due to the presence of the polar hydroxyl group, the overall affinity of the resin component (A) with the developing liquid improves, and the alkali solubility of the exposed sections improves, enabling this unit to contribute to improved resolution. The polycyclic group can be the same polycyclic groups described above in relation to the unit (a1). There are no particular restrictions on this unit (a3) provided the unit is a hydroxyl group containing polycyclic group, and any suitable unit can be used. Specifically, hydroxyl group containing adamantyl groups, and particularly units represented by the general formula (4) shown below, raise the dry etching resistance of the resin component (A), and enable the pattern cross-section to be formed in a rectangular shape, and are consequently preferred.

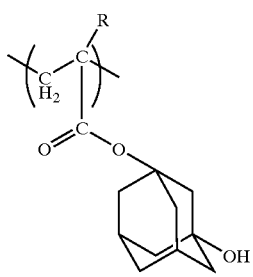
(4)

wherein, R represents a hydrogen atom or a lower alkyl group.

The unit (a4) is a unit derived from a (meth)acrylate ester comprising a polycyclic group which is different from the aforementioned unit (a1), the unit (a2) and the unit (a3). Here, the term "different from the unit (a1), the unit (a2) and the unit (a3)" means the unit does not duplicate any of these units, or in other words, does not retain any acid dissociable, dissolution inhibiting groups of the unit (a1), any lactone groups of the unit (a2), nor any hydroxyl groups of the unit (a3). The polycyclic group can utilize the same polycyclic groups described above in relation to the unit (a1). Examples of materials which can be used as the unit (a4) containing these types of polycyclic groups include the multitude of materials conventionally used as ArF positive resist materials, and in particular, units derived from at least one of tricyclodecanyl (meth)acrylate, adamantyl (meth)acrylate and tetracyclododecanyl (meth)acrylate are preferred because of their commercial availability. Specific examples of this unit are shown in the general formulas (11) to (13) shown below.

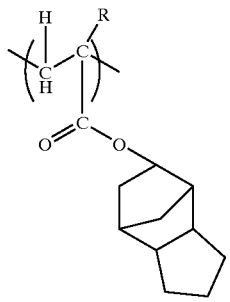
(11)

wherein, R represents a hydrogen atom or a lower alkyl group.

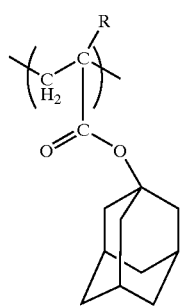
(12)

wherein, R represents a hydrogen atom or a lower alkyl group.

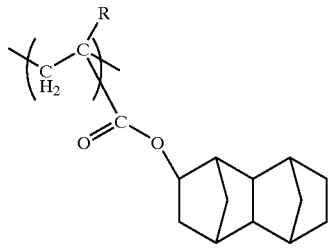
(13)

wherein, R represents a hydrogen atom or a lower alkyl group.

The proportions of each of these units (a1) to (a4) within the resin component (A) are typically from 25 to 50 mol %, and preferably from 30 to 40 mol % for the unit (a1), from 25 to 50 mol %, and preferably from 30 to 40 mol % for the unit (a2), from 10 to 30 mol %, and preferably from 10 to 20 mol % for the unit (a3), and from 5 to 25 mol %, and preferably from 10 to 20 mol % for the unit (a4). If proportions within these ranges are used, then the depth of focus range of an isolated pattern formed from the thus obtained resist composition can be improved significantly, and the proximity effect can be adequately suppressed and significantly reduced. If proportions significantly outside the above ranges are used, then there is a danger of problems occurring such as a reduction in resolution.

In addition, in a resist composition of the present invention, the resin component (A) may also utilize copolymers formed by suitable combinations of the monomers for forming each of the above units (a1) to (a4), with acrylic acid derivatives or methacrylic acid derivatives containing known dry etching resistance improvement groups or acid non-dissociable, dissolution inhibiting groups from conventional chemically amplified positive resists, carboxylic acids with ethylene based double bonds used for imparting alkali solubility such as acrylic acid, methacrylic acid, maleic acid or fumaric acid, or other known monomers used in the production of acrylic resins.

Examples of the aforementioned acrylic acid derivatives include, for example, acrylate esters in which the hydroxyl group of the carboxyl group is protected with a dry etching resistance improvement group or an acid non-dissociable substituent, such as naphthyl acrylate, benzyl acrylate, 3-oxocyclohexyl acrylate, esters of acrylic acid and terpineol and esters of acrylic acid and 3-bromoacetone. In addition, examples of the aforementioned methacrylic acid derivatives include the methacrylic acid derivatives corresponding with these acrylic acid derivatives.

Examples of carboxylic acids with ethylene based double bonds include, for example, acrylic acid, methacrylic acid, maleic acid and fumaric acid.

Examples of known monomers used in the production of acrylic resins include alkyl acrylate esters such as methyl acrylate, ethyl acrylate, propyl acrylate, isopropyl acrylate, n-butyl acrylate, isobutyl acrylate, n-hexyl acrylate, octyl acrylate, 2-ethylhexyl acrylate, lauryl acrylate, 2-hydroxyethyl acrylate and 2-hydroxypropyl acrylate, as well as the corresponding alkyl methacrylate esters.

The resin component (A) can be produced easily by a known radical polymerization or the like of the corresponding (meth)acrylate ester monomer using a radical polymerization initiator such as azobisisobutyronitrile (AIBN). Furthermore, the weight average molecular weight of the resin component (A) is preferably set within a range from 5,000 to 20,000, and even more preferably within a range from 8,000 to 15,000.

In a resist composition of the present invention, the acid generator component (B), which generates acid on exposure, can be appropriately selected from known materials used as acid generators in conventional chemically amplified resists. Examples of the acid generator include onium salts such as diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl) diphenylsulfonium trifluoromethanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate and triphenylsulfonium nonafluorobutanesulfonate. Of these, onium salts with a fluorinated alkylsulfonate ion as the anion are preferred.

This type of radical acid generator component (B) may utilize a single compound, or a combination of two or more compounds. The quantity of the acid generator component (B) is preferably selected within a range from 0.5 to 30 parts by mass, and even more preferably from 1 to 10 parts by mass per 100 parts by mass of the resin component (A). If the quantity is less than 0.5 parts by mass then there is a danger of the pattern formation not proceeding satisfactorily, whereas if the quantity exceeds 30 parts by mass, then achieving a uniform solution becomes difficult, and there is danger of a deterioration in storage stability.

A positive type resist composition of the present invention is obtained as a solution by dissolving the aforementioned resin component (A) and the acid generator component (B) in an organic solvent (C). Provided the organic solvent (C) is capable of dissolving both components to generate a uniform solution, then the solvent used can be one, or two or more solvents selected from amongst known solvents used for conventional chemically amplified resists.

Examples of this type of organic solvent (C) include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate.

A mixed solvent containing at least one of propylene glycol monomethyl ether acetate and ethyl lactate, together with γ-butyrolactone as the organic solvent (C) is preferred. In such a case, the mass ratio of the former and latter components in the mixed solvent is preferably selected from within a range from 70:30 to 97:3.

Furthermore, in a resist composition of the present invention, in order to improve the resist pattern shape and the long term stability (the post exposure stability of the latent image formed by the pattern-wise exposure of the resist layer), a secondary lower aliphatic amine or a tertiary lower aliphatic amine (D) can also be added as a separate component. Examples of these secondary or tertiary lower aliphatic amines (D) include, for example, trimethylamine, diethylamine, triethylamine, di-n-propylamine, tri-n-propylamine, tripentylamine, diethanolamine and triethanolamine, and trialkanolamines are particularly preferred. These may be used singularly, or in combinations of two or more compounds. These types of amines (D) are typically added in quantities within a range from 0.01 to 0.2 parts by mass per 100 parts by mass of the quantity of the resin component (A).

In addition, miscible additives can also be added to a resist composition of the present invention if required, including additive resins for improving the properties of the resist film, surfactants for improving the ease of application, dissolution inhibitors, plasticizers, stabilizers, colorants and halation prevention agents.

Next, as one example of a method of using this type of positive type resist composition of the present invention, a resist pattern formation method of the present invention is described. This method is particularly effective for a resist pattern in which the ratio of the line section size relative to the space section size is no more than 1, and the present example is also applied to the formation of this type of pattern.

First, a positive type resist composition of the present invention is applied to the surface of a substrate formed from a silicon wafer of the like. The method of application can utilize conventional methods such as spin coating, Next, the applied composition is heated at, for example, 80 to 150° C. for 40 to 120 seconds to achieve a prebake and form a photosensitive layer. Next, using an ArF exposure apparatus, ArF excimer laser light is irradiated onto the photosensitive layer through a desired mask pattern to perform selective exposure. Subsequently, the exposed photosensitive layer is heated at, for example, 80 to 150° C. for 40 to 120 seconds to achieve post exposure baking (PEB). Developing is then conducted using an alkali developing liquid such as a 0.1 to 10 mass % aqueous solution of tetramethylammonium hydroxide. In this manner, a pattern which is faithful to the mask pattern, and particularly a resist pattern in which the ratio of the line section size relative to the space section size is no more than 1, can be obtained.

Although a resist composition of the present invention is particularly effective when an ArF excimer laser is used as the exposure source, it is also effective for other types of radiation of shorter wavelength such as $F_2$ lasers, EUV (extreme ultraviolet radiation), VUV (vacuum ultraviolet radiation), electron beams, X-rays and soft X-rays.

EXAMPLES

As follows is a more detailed description of the present invention using a series of examples.

Example 1

First, for the resin component (A), 100 parts by mass of a copolymer of the units represented by each of structural formulas (14) to (17) shown below was prepared. The proportions of each of the units represented by the structural formulas (14) to (17) within the copolymer were set to 35 mol % for the unit represented by the structural formula (14), 35 mol % for the unit represented by the structural formula (15), 15 mol % for the unit represented by the structural formula (16), and 15 mol % for the unit represented by the structural formula (17). The weight average molecular weight of this copolymer was 10,000.

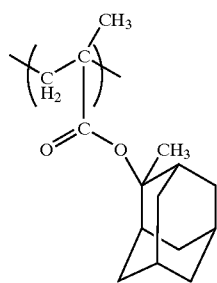

(14)

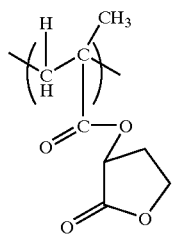

(15)

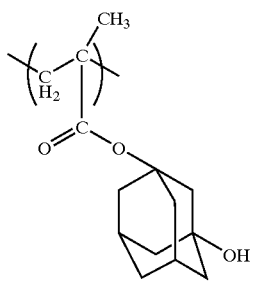

(16)

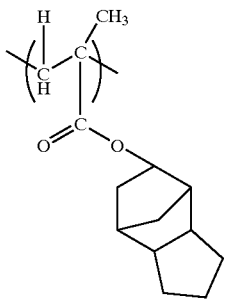

(17)

Furthermore, for the acid generator component (B), 2 parts by mass of triphenylsulfonium nonafluorobutanesulfonate was prepared, for the tertiary lower aliphatic amine (D), 0.2 parts by mass of triethanolamine was prepared, and for the organic solvent (C), a mixed solvent formed from 750 parts by mass of propylene glycol monomethyl ether acetate and 30 parts by mass of γ-butyrolactone was prepared.

Next, the prepared resin component (A), the acid generator component (B) and the aliphatic amine (D) were all dissolved in the aforementioned organic solvent (C), yielding a uniform positive type resist solution (composition) as Example 1 of the present invention.

Subsequently, this resist solution was applied to the surface of a silicon wafer using a spinner and then prebaked for 90 seconds at 125° C. on a hotplate, thereby forming a resist layer with a film thickness of 350 nm.

Subsequently, this film was selectively irradiated with an ArF excimer laser (193 nm), using an ArF exposure apparatus (Micro Step, a brand name, manufactured by ISI Corporation, NA=0.60, σ=0.75), to form the types of patterns described below, and was then subjected to post exposure baking (PEB) treatment at 125° C. for 90 seconds.

The film was then subjected to puddle development for 60 seconds at 23° C. in a 2.38 mass % aqueous solution of tetramethylammonium hydroxide, and was then washed for 20 seconds with water, and dried.

Of the resist patterns formed by the above operation, an isolated resist pattern formed from a 120 nm resist line pattern and a 1080 nm space (1:9) was formed with good shape, and the depth of focus range was 500 nm.

Furthermore, the dimensional difference between a separate 120 nm line and space pattern (1:1) and the aforementioned isolated resist pattern was 50 nm, indicating that the proximity effect was satisfactorily small.

Furthermore, when the 3σ value, which is a measure of the LER (line edge roughness), was determined for this 120 nm line and space pattern (1:1), the result was 7.6 nm.

In addition, when the exposure margin for forming this 120 nm line and space pattern (1:1) within an error range of plus or minus 10% was determined, the result was 10.8% of the center exposure value used for obtaining the line and space pattern.

The aforementioned LER (line edge roughness) refers to non-uniform irregularities formed in the side walls of a resist pattern such as a line and space pattern following developing. The 3σ value which acts as a measure of this phenomenon reduces as these irregularities lessen, indicating a better pattern.

Furthermore, the exposure margin is defined as follows.

The amount of exposure required to form a targeted resist pattern size can be determined to some degree, but is affected by level differences and the like on the actual substrate surface, and may vary. The ability to obtain the targeted resist pattern even if the determined amount of exposure varies somewhat is termed the exposure margin. The larger (wider) this numerical value is the better.

Example 2

A copolymer was produced as the resin component (A), using each of the units of the structural formula (14), the structural formula (15) and the structural formula (16) from Example 1, as is, but replacing the unit of the structural formula (17) with a unit of a structural formula (18) shown below, and 100 parts by mass of this copolymer were prepared. The proportions of each of the units within the copolymer were set to the same values as Example 1 for the units of the structural formula (14), the structural formula (15) and the structural formula (16), whereas the proportion of the unit of the structural formula (18) was set at the same level as the unit of the structural formula (17) in Example 1. The weight average molecular weight of this copolymer was 10,000.

Outside of the resin component (A), preparation was conducted in the same manner as Example 1, yielding a uniform positive type resist solution (composition) as Example 2 of the present invention.

Subsequently, using this resist solution, processing was conducted in the same manner as Example 1 to form resist patterns.

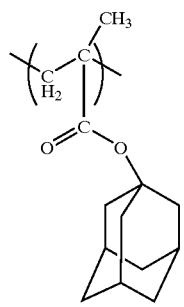

(18)

Of the resist patterns formed by the above operation, an isolated resist pattern formed from a 120 nm resist line pattern and a 1080 nm space (1:9) was formed with good shape, and the depth of focus range was 600 nm.

Furthermore, the dimensional difference between a separate 120 nm line and space pattern (1:1) and the aforementioned isolated resist pattern was 45 nm, indicating that the proximity effect was satisfactorily small.

Furthermore, when the 3σ value, which is a measure of the LER (line edge roughness), was determined for this 120 nm line and space pattern (1:1), the result was 8.3 nm.

In addition, when the exposure margin for forming this 120 nm line and space pattern (1:1) within an error range of plus or minus 10% was determined, the result was 11.4% of the center exposure value used for obtaining the line and space pattern.

Example 3

A copolymer was produced as the resin component (A), using each of the units of the structural formula (14), the structural formula (16) and the structural formula (18) from Example 2, as is, but replacing the unit of the structural formula (15) with a unit of a structural formula (19) shown below, and 100 parts by mass of this copolymer were prepared. The proportions of each of the units within the copolymer were set to the same values as Example 2 for the units of the structural formula (14), the structural formula (16) and the structural formula (18), whereas the proportion of the unit of the structural formula (19) was set at the same level as the unit of the structural formula (15) in Example 2. The weight average molecular weight of this copolymer was 10,000.

Outside of the resin component (A), preparation was conducted in the same manner as Example 1, yielding a uniform positive type resist solution (composition) as Example 3 of the present invention.

Subsequently, using this resist solution, processing was conducted in the same manner as Example 1 to form resist patterns.

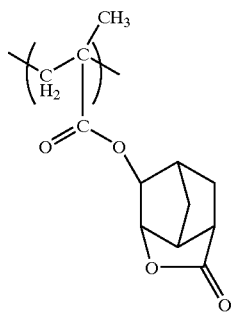

(19)

Of the resist patterns formed by the above operation, an isolated resist pattern formed from a 120 nm resist line pattern and a 1080 nm space (1:9) was formed with good shape, and the depth of focus range was 600 nm.

Furthermore, the dimensional difference between a separate 120 nm line and space pattern (1:1) and the aforementioned isolated resist pattern was 50 nm, indicating that the proximity effect was satisfactorily small.

Furthermore, when the 3σ value, which is a measure of the LER (line edge roughness), was determined for this 120 nm line and space pattern (1:1), the result was 6.5 nm.

In addition, when the exposure margin for forming this 120 nm line and space pattern (1:1) within an error range of plus or minus 10% was determined, the result was 9.2% of the center exposure value used for obtaining the line and space pattern.

Comparative Example 1

A copolymer was produced as the resin component (A), using each of the units of the structural formula (14), the structural formula (15) and the structural formula (16) from Example 1, as is, but without using the unit of the structural formula (17), and 100 parts by mass of this copolymer were prepared. The proportions of each of the units within the copolymer were set to 40 mol % for the unit represented by the structural formula (14), 40 mol % for the unit represented by the structural formula (15), and 20 mol % for the unit represented by the structural formula (16). The weight average molecular weight of this copolymer was also 10,000.

Outside of the resin component (A), preparation was conducted in the same manner as Example 1, yielding a uniform positive type resist solution (composition) as Comparative Example 1 of the present invention.

Subsequently, using this resist solution, processing was conducted in the same manner as Example 1 to form resist patterns.

Of the resist patterns formed by the above operation, an isolated resist pattern formed from a 120 nm resist line pattern and a 1080 nm space (1:9) was formed with good shape, although the depth of focus range was 400 nm.

Furthermore, the dimensional difference between a separate 120 nm line and space pattern (1:1) and the aforementioned isolated resist pattern was 45 nm, showing a small proximity effect.

Furthermore, when the 3σ value, which is a measure of the LER (line edge roughness), was determined for this 120 nm line and space pattern (1:1), the result was 11.3 nm.

In addition, when the exposure margin for forming this 120 nm line and space pattern (1:1) within an error range of plus or minus 10% was determined, the result was 9.1% of the center exposure value used for obtaining the line and space pattern.

Comparative Example 2

A copolymer was produced as the resin component (A), using each of the units of the structural formula (14), the structural formula (15) and the structural formula (16) from Example 1, as is, but without using the unit of the structural formula (17), and 100 parts by mass of this copolymer were prepared. The proportions of each of the units within the copolymer were set to 35 mol % for the unit represented by the structural formula (14), 35 mol % for the unit represented by the structural formula (15), and 30 mol % for the unit represented by the structural formula (16). The weight average molecular weight of this copolymer was also 10,000.

Furthermore, the organic solvent (C) was also changed from that of Example 1, and a mixed solvent formed from 750 parts by mass of ethyl lactate and 30 parts by mass of γ-butyrolactone was prepared.

Outside of these alterations, preparation was conducted in the same manner as Example 1, yielding a uniform positive type resist solution (composition) as Comparative Example 2 of the present invention.

Subsequently, using this resist solution, processing was conducted in the same manner as Example 1 to form resist patterns.

Of the resist patterns formed by the above operation, an isolated resist pattern formed from a 120 nm resist line pattern and a 1080 nm space (1:9) was formed with good shape, although the depth of focus range was 300 nm.

Furthermore, the dimensional difference between a separate 120 nm line and space pattern (1:1) and the aforementioned isolated resist pattern was 60 nm, indicating no reduction in the proximity effect.

Furthermore, when the 3σ value, which is a measure of the LER (line edge roughness), was determined for this 120 nm line and space pattern (1:1), the result was 8.3 nm.

In addition, when the exposure margin for forming this 120 nm line and space pattern (1:1) within an error range of plus or minus 10% was determined, the result was 8.8% of the center exposure value used for obtaining the line and space pattern.

The above results are summarized below.

|  | depth of focus range [nm] | dimensional difference [nm] | 3σ [nm] | exposure margin [%] |
|---|---|---|---|---|
| Example 1 | 500 | 50 | 7.6 | 10.8 |
| Example 2 | 600 | 45 | 8.3 | 11.4 |
| Example 3 | 600 | 50 | 6.5 | 9.2 |
| Comparative Example 1 | 400 | 45 | 11.3 | 9.1 |
| Comparative Example 2 | 300 | 60 | 8.3 | 8.8 |

From the above results it was evident that Examples 1 to 3 of the present invention had particularly superior depth of focus range values for the isolated resist pattern, also displayed a small dimensional difference between patterns indicating the invention was effective in reducing the proximity effect, and offered an excellent level of resolution.

Furthermore, it was clear that Examples 1 to 3 of the present invention also displayed excellent results for LER (line edge roughness) and exposure margin.

INDUSTRIAL APPLICABILITY

A positive type resist composition of the present invention such as that described above uses as a base resin, a resin component comprising, within the principal chain, a unit derived from a (meth)acrylate ester containing a specific quaternary copolymer, for which the solubility in alkali increases under the action of acid, and consequently because the composition is applicable to use with ArF excimer laser light, a chemically amplified positive type resist composition is obtained which displays excellent resolution, enables the depth of focus range of an isolated resist pattern to be improved, and enables the proximity effect to be suppressed and reduced. Furthermore, in addition to these effects, this positive type resist composition also provides additional effects, enabling a reduction in the LER (line edge roughness) and an increase in the exposure margin.

Accordingly, as a chemically amplified positive type resist using an ArF excimer laser as the light source, a composition of the present invention can be ideally used in the production of semiconductor elements and the like which require ultra fine processing.

Furthermore, a resist pattern formation method of the present invention utilizes a positive type resist composition described above, and consequently is a particularly effective method for producing resist patterns in which the ratio between the size of the line sections relative to the size of the space sections is less than 1.

Accordingly, a composition of the present invention is extremely useful for industrial applications.

What is claimed is:

1. A positive type resist composition formed by dissolving (A) a resin component with a unit derived from a (meth) acrylate ester in a principal chain, for which solubility in alkali increases under action of acid, and (B) an acid generator component which generates acid on exposure, in an organic solvent component (C), wherein said resin component (A) is a copolymer comprising (a1) a unit derived from a (meth)acrylate ester comprising an acid dissociable, dissolution inhibiting group containing a polycyclic group, (a2) a unit derived from a (meth)acrylate ester comprising a lactone containing monocyclic group or polycyclic group, (a3) a unit derived from a (meth)acrylate ester comprising a hydroxyl group containing polycyclic group, and (a4) a unit derived from a (meth)acrylate ester comprising a polycyclic group which is different from said unit (a1), said unit (a2) and said unit (a3).

2. A positive type resist composition according to claim 1, wherein said unit (a1) is at least one type of unit selected from a group consisting of general formulas (1), (2) and (3) shown below:

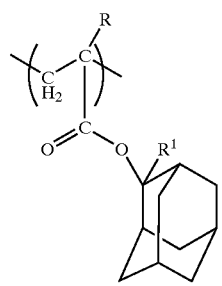
(1)

wherein, R represents a hydrogen atom or a lower alkyl group, and R¹ represents a lower alkyl group,

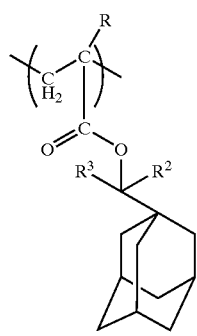
(2)

wherein, R represents a hydrogen atom or a lower alkyl group, and R² and R³ each represent, independently, a lower alkyl group, and

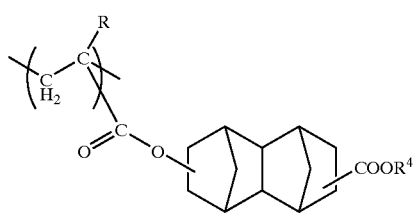
(3)

wherein, R represents a hydrogen atom or a lower alkyl group, and R⁴ represents a tertiary alkyl group.

3. A positive type resist composition according to claim 2, wherein said unit (a1) is represented by said general formula (1), and R¹ in said general formula (1) is a methyl group.

4. A positive type resist composition according to claim 1, wherein said unit (a2) is a unit derived from a (meth)acrylate ester comprising either a lactone group or a lactone group containing bicycloalkyl group.

5. A positive type resist composition according to claim 4, wherein said unit (a2) is a unit derived from a (meth)acrylate ester of γ-butyrolactone.

6. A positive type resist composition according to claim 1, wherein said unit (a3) is a unit derived from a (meth)acrylate ester comprising a hydroxyl group containing adamantyl group.

7. A positive type resist composition according to claim 6, wherein said unit (a3) is a unit represented by a general formula (4) shown below:

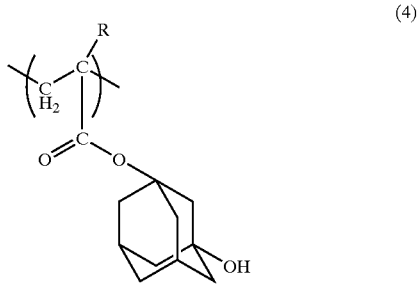
(4)

wherein, R represents a hydrogen atom or a lower alkyl group.

8. A positive type resist composition according to claim 1, wherein said unit (a4) is a unit derived from at least one compound selected from a group consisting of tricyclodecanyl (meth)acrylate, adamantyl (meth)acrylate and tetracyclododecanyl (meth)acrylate.

9. A positive type resist composition according to claim 1, wherein said unit (a1) is within a range from 25 to 50 mol %, said unit (a2) is within a range from 25 to 50 mol %, said unit (a3) is within a range from 10 to 30 mol %, and said unit (a4) is within a range from 5 to 25 mol %.

10. A positive type resist composition according to claim 1, wherein said acid generator component (B) is an onium salt with a fluorinated alkylsulfonate ion as an anion.

11. A positive type resist composition according to claim 1, wherein a secondary lower aliphatic amine or a tertiary lower aliphatic amine (D) is added in a quantity of 0.01 to 0.2 parts by mass per 100 parts by mass of a quantity of said resin component (A).

12. A resist pattern formation method comprising the steps of providing a positive type resist composition according to any one of claim 1 through claim 11 on a substrate, conducting a prebake at 80 to 150° C. for 40 to 120 seconds, performing selective exposure, and then conducting post exposure baking at 80 to 150° C. for 40 to 120 seconds, and performing alkali developing to form a resist pattern in which a ratio of line section size relative to space section size is no more than 1.

* * * * *